(12) United States Patent
Wiedrick

(10) Patent No.: US 12,506,469 B2
(45) Date of Patent: Dec. 23, 2025

(54) SINGLE RAIL BIDIRECTIONAL PULSE DRIVER

(71) Applicant: Google LLC, Mountain View, CA (US)

(72) Inventor: Roth Wiedrick, Mountain View, CA (US)

(73) Assignee: Google LLC, Mountain View, CA (US)

( * ) Notice: Subject to any disclaimer, the term of this patent is extended or adjusted under 35 U.S.C. 154(b) by 236 days.

(21) Appl. No.: 18/234,998

(22) Filed: Aug. 17, 2023

(65) Prior Publication Data

US 2024/0097663 A1    Mar. 21, 2024

Related U.S. Application Data

(60) Provisional application No. 63/407,551, filed on Sep. 16, 2022.

(51) Int. Cl.
*H03K 3/57* (2006.01)
*H03K 3/352* (2006.01)

(52) U.S. Cl.
CPC ............ *H03K 3/57* (2013.01); *H03K 3/352* (2013.01)

(58) Field of Classification Search
CPC .. H03K 3/57; H03K 3/53; H03K 3/45; H03K 3/00; H03K 3/01; H03K 3/02; H03K 3/36; H03K 3/35; H03K 3/352; H02M 3/07; H02M 3/10; H02M 3/125
USPC ................ 327/582, 365, 369, 370, 376, 377
See application file for complete search history.

(56) References Cited

U.S. PATENT DOCUMENTS

| | | | |
|---|---|---|---|
| 9,997,286 B2 * | 6/2018 | Herman | H01F 7/20 |
| 10,396,662 B2 * | 8/2019 | Lubomirsky | H02J 3/381 |
| 12,176,142 B2 * | 12/2024 | Lamoureux | H01F 7/0252 |
| 2017/0092401 A1 | 3/2017 | Herman | |

FOREIGN PATENT DOCUMENTS

| | | |
|---|---|---|
| AU | 2012 212 534 A1 | 8/2013 |
| AU | 2012 212 534 B2 | 8/2013 |
| CN | 1 507 143 A | 6/2004 |

* cited by examiner

*Primary Examiner* — Hai L Nguyen
(74) *Attorney, Agent, or Firm* — Lerner David LLP

(57) ABSTRACT

Various arrangements involving a bidirectional pulse driver circuit are presented herein. The driver circuit can include a forward pulse trigger circuit and a forward pulse loop circuit. The forward pulse loop circuit can include a first silicon-controlled rectifier (SCR) that is activated by the forward pulse trigger circuit. The driver circuit can include a reverse pulse trigger circuit and a reverse pulse loop circuit. The reverse pulse loop circuit can include a second SCR that is activated by the reverse pulse trigger circuit. The driver circuit can also include a controller that activates the forward pulse trigger circuit and the reverse pulse trigger circuit in a first pattern to cause a current pulse to be applied to a load in a forward direction and in a second pattern to cause the current pulse to be applied to the load in a reverse direction.

12 Claims, 11 Drawing Sheets

SINGLE RAIL BIDIRECTIONAL PULSE DRIVER

CROSS REFERENCES TO RELATED APPLICATIONS

This application claims priority to U.S. Provisional Patent Application No. 63/407,551, filed Sep. 16, 2022, entitled "Single Rail Bidirectional Pulse Driver," the entire disclosure of which is hereby incorporated by reference for all purposes.

BACKGROUND

When current needs to be driven through a load alternatively in two directions, a conventional H-Bridge circuit can be used. In an H-Bridge circuit, four transistors, such as metal-oxide-semiconductor field-effect transistors (MOSFETS) are used to control which side of the load a power source is connected and to which side of the load ground is connected. However, in some circumstances, an H-Bridge circuit is not desired. For example, having multiple transistors may require a significant amount of space within a device (e.g., on a printed circuit board) and may be relatively costly, due to the number of transistors, especially if power transistors, such as power MOSFETs are used.

SUMMARY

Various embodiments are described related to a bidirectional pulse driver circuit. In some embodiments, a bidirectional pulse driver circuit is described. The device may comprise a forward pulse trigger circuit. The device may comprise a forward pulse loop circuit connected with a load. The forward pulse loop circuit may comprise a first silicon-controlled rectifier (SCR) that may be activated by the forward pulse trigger circuit. The device may comprise a reverse pulse trigger circuit. The device may comprise a reverse pulse loop circuit connected with the load. The reverse pulse loop circuit may comprise a second SCR that may be activated by the reverse pulse trigger circuit. The device may comprise a controller in communication with the forward pulse trigger circuit and the reverse pulse trigger circuit. The controller may activate the forward pulse trigger circuit and the reverse pulse trigger circuit in a first pattern to cause a current pulse to be applied to the load in a first direction. The controller may activate the forward pulse trigger circuit and the reverse pulse trigger circuit in a second pattern to cause the current pulse to be applied to the load in a second direction.

Embodiments of such a device may include one or more of the following features: the forward pulse loop circuit may comprise a first capacitor. A first terminal of the first capacitor may be connected with an anode of the first SCR. A second terminal of the first capacitor may be connected with a terminal of the load. The reverse pulse loop circuit may comprise a second capacitor. A first terminal of the second capacitor may be connected with a cathode of the second SCR. A second terminal of the first capacitor may be connected with the terminal of the load and the second terminal of the first capacitor. The first pattern may comprise the reverse pulse trigger circuit being activated a plurality of times, then the forward pulse trigger circuit being activated. The second pattern may comprise the forward pulse trigger circuit being activated the plurality of times, then the reverse pulse trigger circuit being activated. The device may further comprise the load. The load may comprise a wire coiled around one or more soft magnets. A polarity of the one or more soft magnets may be flipped based on a direction of the current pulse. The device may further comprise a tablet system comprising a tablet computer and a base. The one or more soft magnets, the forward pulse trigger circuit, the forward pulse loop circuit, the reverse pulse trigger circuit, and the reverse pulse loop circuit may be incorporated as part of the base. The tablet computer may be configured to output an indication that the tablet computer and the base are ready for separation based on whether the first pattern or the second pattern was activated by the controller.

In some embodiments, a method for using a bidirectional pulse driver circuit to reverse a polarity of a soft magnet is described. The method may comprise determining a desired polarity for the soft magnet. The method may comprise, based on the desired polarity, adjusting a potential of a load bias point by triggering a first silicon-controlled rectifier (SCR). The method may comprise, after trigger the first SCR, allowing the first SCR to achieve low-current dropout. The method may comprise, based on the desired polarity, triggering a second SCR to cause a current pulse to applied to a load. The current pulse may change the polarity of the soft magnet to the desired polarity.

Embodiments of such a method may include one or more of the following features: determining a second desired polarity for the soft magnet. The method may further comprise, based on the second desired polarity, adjusting the potential of the load bias point by triggering the second SCR. The method may further comprise, after trigger the second SCR, allowing the second SCR to achieve low-current dropout. The method may further comprise, based on the second desired polarity, triggering the first SCR to cause a second current pulse to be applied to the load in an opposite direction of the current pulse. The second current pulse may change the polarity of the soft magnet to the second desired polarity. The load may comprise a wire coiled around the soft magnet. Triggering the first SCR and the second SCR may be performed according to either a first defined pattern or a second defined pattern based on the desired polarity. A controller may trigger the first SCR via a first trigger circuit and the second SCR via a second trigger circuit. The current pulse may be created using charge stored in one or more capacitors. The first SCR and the second SCR may be part of a circuit integrated in a tablet docking system. The method may further comprise after triggering the second SCR, outputting, for presentation by a display of a computerized tablet of the tablet docking system, a message indicating that a state of tablet docking.

In some embodiments, a tablet docking system is described. The system may comprise a computerized tablet. The system may comprise a dock onto which the computerized tablet docks. The system may comprise a bidirectional pulse driver circuit comprising a forward pulse trigger circuit. A bidirectional pulse driver circuit may comprise a forward pulse loop circuit connected with a load comprising a wire coiled around a soft magnet. The forward pulse loop circuit may comprise a first silicon-controlled rectifier (SCR) that may be activated by the forward pulse trigger circuit. A bidirectional pulse driver circuit may comprise a reverse pulse trigger circuit. A bidirectional pulse driver circuit may comprise a reverse pulse loop circuit connected with the load. The reverse pulse loop circuit may comprise a second SCR that may be activated by the reverse pulse trigger circuit. A bidirectional pulse driver circuit may comprise a controller in communication with the forward pulse trigger circuit and the reverse pulse trigger circuit. The controller may activate the forward pulse trigger circuit and the reverse pulse trigger circuit in a first pattern to cause a current pulse to be applied to the load in a first direction to set a polarity of the soft magnet. The controller may activate the forward pulse trigger circuit and the reverse pulse trigger circuit in a second pattern to cause the current pulse to be applied to the load in a second direction to set the polarity of the soft magnet in reverse from the first pattern.

Embodiments of such a system may include one or more of the following features: the polarity of the soft magnet associated with the first pattern may allow for the computerized tablet to be removed from the dock easier than the polarity of the soft magnet associated with the second pattern.

BRIEF DESCRIPTION OF THE DRAWINGS

A further understanding of the nature and advantages of various embodiments may be realized by reference to the following figures. In the appended figures, similar components or features may have the same reference label.

DETAILED DESCRIPTION

A polarity of a soft magnet can be reversed based on a direction in which a pulse of current is applied to a wire coiled around the soft magnet. A soft magnet may be used for various purposes, such as for holding an electronic device in place when it is docked. As an example, when a tablet computer is docked with a base, the soft magnet may have a first polarization, which helps the tablet computer remain firmly docked with the base. When the tablet computer is to be removed from the dock, the polarity of the soft magnet can be reversed, causing the dock and the tablet computer to either separate or at least making it relatively easier for a user to physically separate the tablet computer from the dock.

Detailed herein are arrangements directed to a circuit that allows a pulse of current to be applied to a load, such as one or more wire-coiled soft magnets, in both directions. The circuit can make use of multiple SCRs in order to control when current is permitted to flow to the load. The circuit detailed herein can allow for high current and high voltage pulses to be applied to a load, such as an electropermanent magnet assembly that includes one or more wire-coiled soft magnets. Further, the embodiments detailed herein can rely on a single power supply rail.

Figure 1:
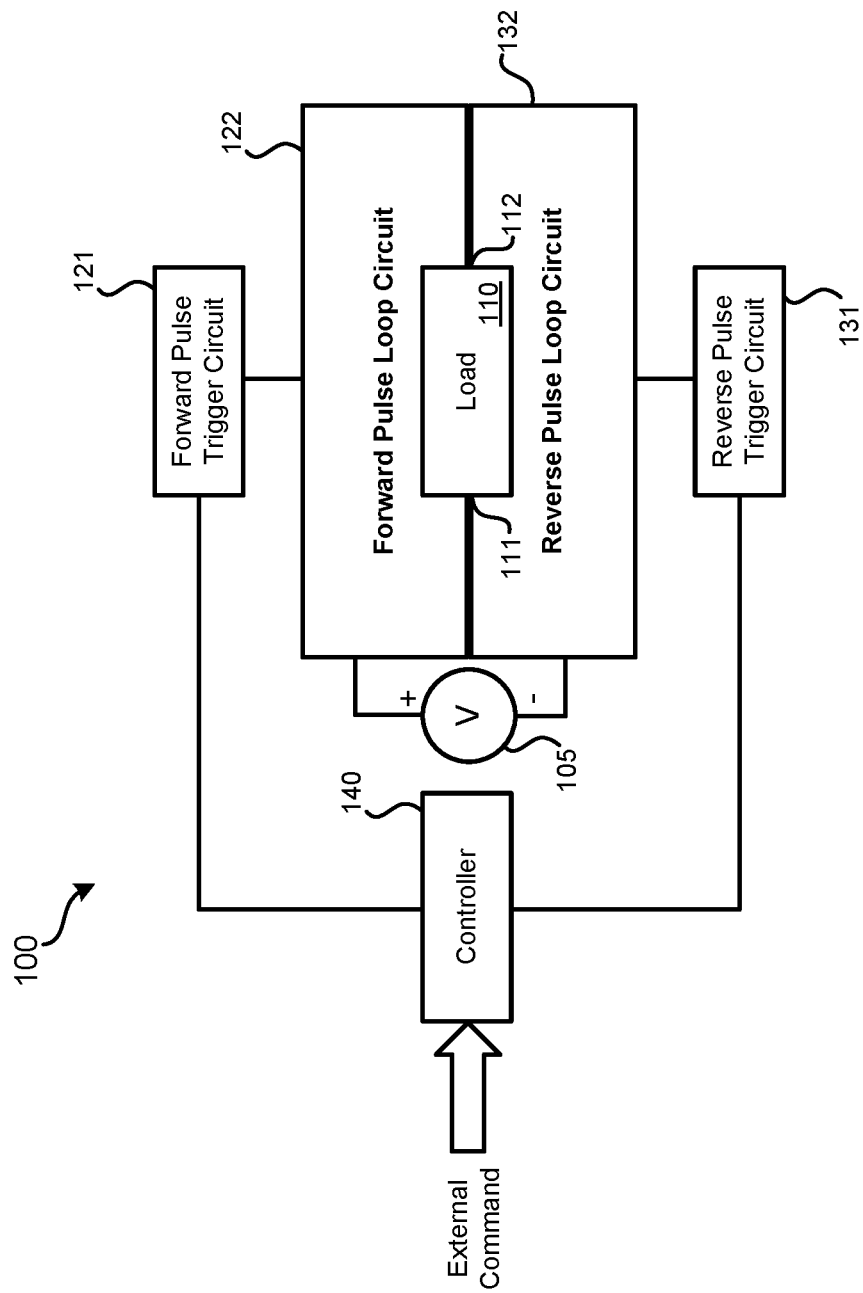
FIG. 1 illustrates a block diagram of an embodiment of a bidirectional pulse driver circuit.

Further detail is provided in relation to the figures. FIG. 1 illustrates a block diagram of an embodiment of a bidirectional pulse driver circuit 100 ("circuit 100"). Circuit 100 can include: voltage source 105; load 110; forward pulse trigger circuit 121; forward pulse loop circuit 122; reverse pulse trigger circuit 131; reverse pulse loop circuit 132; and controller 140. Voltage source 105 creates a single positive voltage (a single "rail") and is connected with forward pulse loop circuit 122 and reverse pulse loop circuit 132; however, it should be understood that voltage source 105 can additionally provide power to other components of circuit 100.

Load 110 can be one or more devices or circuits to which a pulse of current (or, stated another way, a pulse of voltage) is to be driven in both a forward direction and reverse direction. That is, in some circumstances, the pulse may be applied to terminal 111 of load 110 and in other circumstances a similar pulse may be applied to terminal 112 of the load. The load may be an inductive load, meaning the load has a significant inductance. For example, load 110 may be modelled as an inductor and resistor, as presented in FIG. 2. In some embodiments, load 110 may have an inductance of between 1.5 uH and 5.5 uH and a resistance between 100 milliohms and 500 milliohms. In some embodiments, load 110 can include an electropermanent magnet assembly that includes one or more soft magnets. Load 110 can represent one or more wires or coils wrapped around one or more soft magnets, which can be in the presence of one or more hard magnets of the electropermanent magnet assembly. Such soft magnets can have their polarity flipped relatively easily (in comparison to hard magnets) by having a current pulse passed through the wire wrapped or coiled around the soft magnets in a particular direction. Once the pulse has been applied to a wire coiled around the soft magnets in a first, particular direction, the polarity of the soft magnets may be set. The polarity may stay in the same state until a current pulse is passed through the wires or coil wrapped around the soft magnets in a second, opposite direction, which causes the polarity to flip. Once flipped, the polarity may again stay in this state until a current pulse is applied again in the first direction. In other embodiments, the load may be some other form of inductive or non-inductive load. As an example, some form of motor may be used as load 110.

Forward pulse trigger circuit 121 may serve to, in response to a signal or command from controller 140, trigger forward pulse loop circuit 122 to activate. Forward pulse trigger circuit 121 may include multiple components, including physical switches, transistors, MOSFETs, resistors, and diodes, to create a (voltage or current) pulse to trigger forward pulse loop circuit 122. In some embodiments, it may be possible for controller 140 to directly trigger forward pulse loop circuit 122; however, in other embodiments, the voltage or current that is output by controller 140 may be insufficient and therefore an intermediary forward pulse trigger circuit 121 may be used to trigger forward pulse loop circuit 122. Notably, forward pulse trigger circuit may only trigger activation of forward pulse loop circuit 122; forward pulse loop circuit 122 may deactivate on its own when a condition is met, such as the amount of current passing through the loop decreasing below a defined threshold.

Forward pulse loop circuit 122 serves two purposes: first, to create a current pulse through load 110 that results in the current pulse passing through load 110 from terminal 112 to terminal 111; and second, to allow reverse pulse loop circuit to create a current pulse through load 110 which results in the current pulse passing through load 110 from terminal 111 to terminal 112 (i.e., the opposite direction).

Forward pulse loop circuit 122 is triggered by forward pulse trigger circuit 121 and may be triggered in two circumstances. First, when a current pulse is to be applied through load 110 from terminal 111 to terminal 112, forward pulse loop circuit 122 may be triggered one or more times in order to eliminate or at least decrease charge that has been stored within forward pulse loop circuit 122. (Notably, when load 110 includes wire or coil wrapped around one or more soft magnets, an incidental pulse that does not change polarity of the soft magnets does not adversely affect the magnets or the circuit generally.) Second, when a current pulse is to be applied through load 110 from terminal 112 to terminal 111, forward pulse loop circuit 122 may be triggered in order to cause a current pulse to pass through load 110 from terminal 112 to terminal 111.

Reverse pulse trigger circuit 131 can function similarly to forward pulse trigger circuit 121 as previously detailed, but instead serves as a trigger to activate reverse pulse loop circuit 132. Reverse pulse loop circuit 132 serves two purposes: first, to create a current pulse through load 110 that results in the current pulse passing through load 110 from terminal 111 to terminal 112; and second, to allow forward pulse loop circuit 122 to create a current pulse through load 110 which results in the current pulse passing through load 110 from terminal 112 to terminal 111.

Reverse pulse loop circuit 132 is triggered by reverse pulse trigger circuit 131 and may be triggered in two circumstances. First, when a current pulse is to be applied through load 110 from terminal 112 to terminal 111, reverse pulse loop circuit 132 may be triggered one or more times in order to eliminate or at least decrease charge that has been stored within reverse pulse loop circuit 132. (As previously noted, when load 110 is a wire coiled around one or more soft magnets, an incidental pulse that does not change polarity of the soft magnets does not adversely affect the magnets or the circuit generally.) Second, when a current pulse is to be applied through load 110 from terminal 111 to terminal 112, reverse pulse loop circuit 132 may be triggered in order to cause a current pulse to pass through load 110 from terminal 111 to terminal 112.

Therefore, as described above, both forward pulse loop circuits 122 and reverse pulse loop circuit 132 are activated in different patterns depending on the direction in which the current pulse should be applied to load 110. Controller 140 may serve to control forward pulse trigger circuit 121 and reverse pulse trigger circuit 131 in a pattern depending on the direction in which the current pulse is to be applied to load 110. Controller 140 may be a processor, microcontroller, ASIC, or some other processing device or processing system that is capable of received a command and outputting a control pattern of signals based on the command. The external command may be received from another device, another processing device present within the same device in which circuit 100 is present, or another process being executed on a same processor that is functioning as controller 140. When a command is received, controller 140 can determine in which direction a current pulse is to be applied to load 110 and can activate both forward pulse trigger circuit 121 and reverse pulse trigger circuit 131 in the proper pattern to cause the desired current pulse to be applied to load 110.

Figure 2:
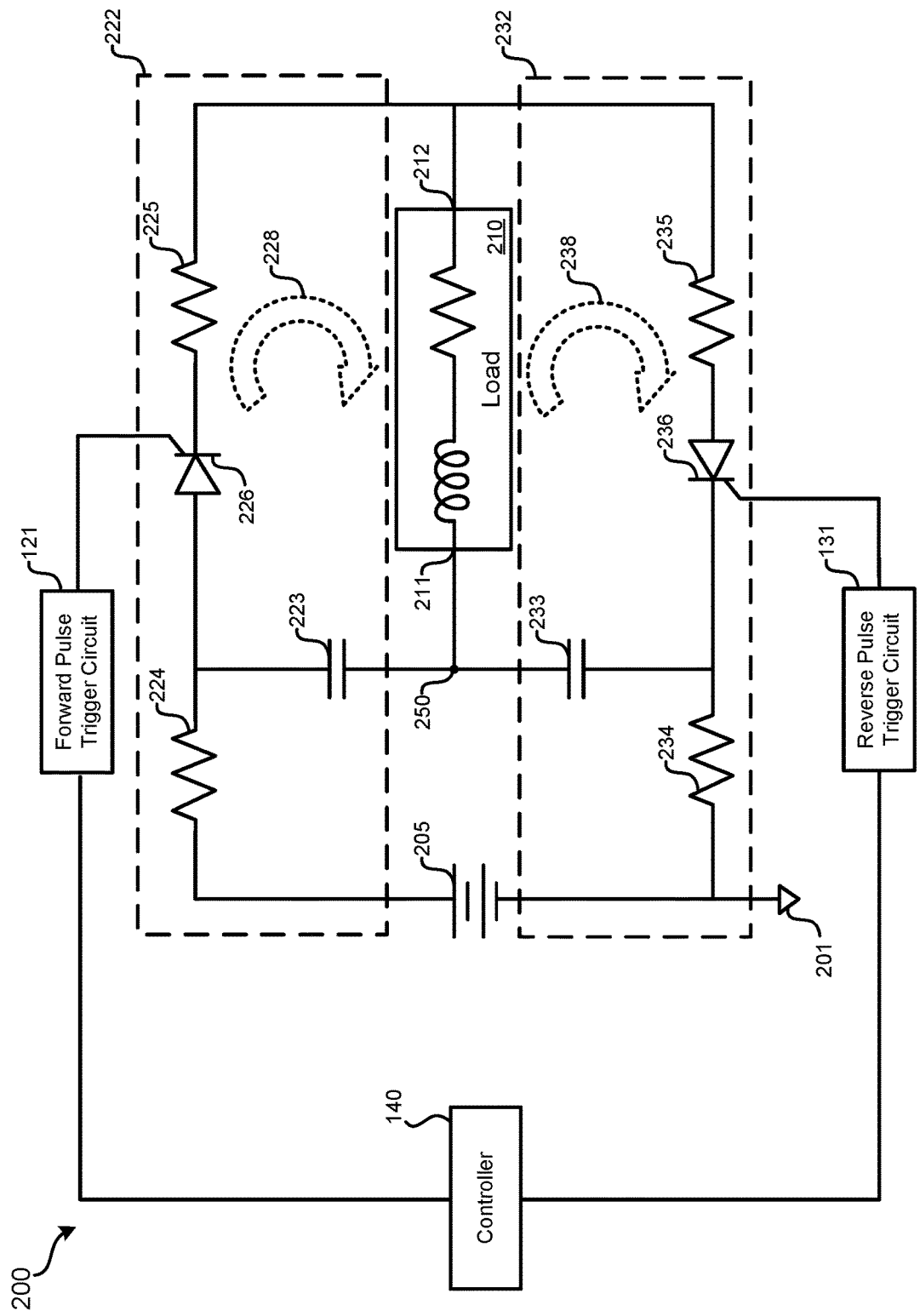
FIG. 2 illustrates a circuit diagram of an embodiment of a bidirectional pulse driver circuit.

FIG. 2 illustrates a circuit diagram of an embodiment of a bidirectional pulse driver circuit ("circuit 200"). Circuit 200 can include: load 210; forward pulse trigger circuit 121; forward pulse loop circuit 222; reverse pulse trigger circuit 131; reverse pulse loop circuit 232; and controller 140. Controller 140, forward pulse trigger circuit 121, and reverse pulse trigger circuit 131 can function as detailed in relation to circuit 100 of FIG. 1.

Load 210, which represents a possible embodiment of load 110, is represented as an inductor and resistor in series. The inductor and resistor are intended to represent that the load has a inductance and resistance, such as provided by an electropermanent magnet assembly that includes one or more soft magnets around each of which a coil of wire is present through which the current pulse passes.

Forward pulse loop circuit 222 can represent an embodiment of forward pulse loop circuit 122 of circuit 100 of FIG. 1. Forward pulse loop circuit 222 can include: capacitor 223; resistor 224; resistor 225; and SCR 226. Reverse pulse loop circuit 232 can represent an embodiment of reverse pulse loop circuit 132 of circuit 100 of FIG. 1. Reverse pulse loop circuit 232 can include: capacitor 233; resistor 234; resistor 235; and SCR 236. SCR 226 and SCR 236 may function as Schottky diodes with a gate. In an SCR, when the gate is triggered, current is permitted to flow from the anode to the cathode of the SCR. Current is permitted to continue to flow in this direction until the amount of current drops below a threshold (defined by the characteristics of the SCR), the SCR enters a cutoff mode and electrically disconnects the anode from the cathode of the SCR. In other embodiments, rather than using SCRs, a similar component or combination of components can be used to achieve a similar functionality. As an example, a gallium nitride (GaN) FET could be used.

In steady state, when neither SCR 226 nor SCR 236 is open due to being triggered by forward pulse trigger circuit 121 or reverse pulse trigger circuit 131, respectively, voltage source 205 serves to charge capacitor 223 and capacitor 233. In some embodiments, capacitors 223 and 233 can have the same capacitance, which may be between 50 µF and 300 µF. Over time, charge will build on capacitors 223 and 233 such that approximately half of the potential of voltage source 205 is present on capacitor 223 and half on capacitor 233. Resistors 224, which can have a resistance between 100 Ohms and 10,000 Ohms, can prevent a large draw of current from voltage source 205 when charging capacitors 223 and 233 and to prevent capacitors 223 and 233 from recharging too quickly during activation of forward pulse loop circuit 222 or reverse pulse loop circuit 232. In some embodiments, resistor 224 is optional if voltage source 205 can provide current limiting and/or capacitor charge state detection. For example, a high voltage capacitor charger controller could be used as voltage source 205, with resistor 224 being eliminated from the circuit.

If a pulse of current is to be applied to load 210 at terminal 212, the potential present at node 250, which can be referred to as the load bias, may first be decreased as close to ground as possible. To do this, controller 140 may cause reverse pulse trigger circuit 131 to trigger SCR 236 one or more times (e.g., a train of pulses may be applied to the gate of SCR 236), which causes charge stored in capacitor 233 to be discharged through load 210 in the direction indicated by arrow 238. While the potential present at node 250 may not fully reach ground, 90-99% of the charge stored by capacitor 233 may be discharged, allowing node 250 to behave temporarily as a virtual ground. When SCR 236 enter cutoff mode, capacitor 233 may immediately begin to recharge; therefore, the sooner after SCR 236 enters cutoff mode that forward pulse trigger circuit 121 is triggered, the higher magnitude the forward current pulse will be.

After SCR 236 of reverse pulse trigger circuit 232 has entered cutoff mode, controller 140 may trigger forward pulse trigger circuit 121 to output a single trigger to SCR 226. This single trigger activates the gate of SCR 226 such that a single current pulse is applied to terminal 212 of load 210 as indicated by arrow 228. If load 210 includes the wire coiled around one or more soft magnets (such as an electropermanent magnet assembly that includes one or more soft magnets), if the polarity of the soft magnets is in an opposite direction than that associated with arrow 228, the current pulse passing through forward pulse loop circuit 222 can reverse the polarity of the soft magnets.

However, if instead a pulse of current is to be applied to load 210 at terminal 211, the potential present at node 250 may first be increased as close to the rail voltage of voltage source 205 as possible. To do this, controller 140 may cause forward pulse trigger circuit 121 to trigger SCR 226 one or more times (e.g., a train of pulses may be applied to the gate of SCR 226), which causes charge stored in capacitor 223 to be discharged through load 210 in the direction indicated by arrow 228 and charge capacitor 233 up towards the rail voltage. While the potential present at node 250 may not fully reach the rail voltage, 90-99% of the charge stored by capacitor 223 may be discharged, allowing node 250 to function as a virtual rail. When SCR 226 enters cutoff mode, capacitor 223 may immediately begin to recharge; therefore, the sooner after SCR 226 enters cutoff mode that reverse pulse trigger circuit 131 is triggered, the higher magnitude the reverse current pulse will be.

After SCR 226 of forward pulse trigger circuit 222 has entered cutoff mode, controller 140 may trigger reverse pulse trigger circuit 131 to output a single trigger to SCR 236. This single trigger activates the gate of SCR 236 such that a single current pulse is applied to terminal 211 of load 210 as indicated by arrow 238. If load 210 includes the wire coiled around one or more soft magnets, if the polarity of the soft magnets is in an opposite direction than that associated with arrow 238, the current pulse passing through reverse pulse loop circuit 232 can reverse the polarity of the soft magnets.

Resistors 225, 234, and 235 can represent the parasitic resistance of the circuit and may not represent discrete components. These resistors may be in the 1-900 milliohm range.

Components of circuit 200 can have alternate implementations in accordance with circuit theory. As an example, capacitor 223 can be implemented as multiple capacitors in parallel. Notably, with the exception of SCRs 226 and 236, no other components are present within forward pulse loop circuit 222 and reverse pulse loop circuit 232.

Notably, in circuit 200, certain resistors may not be discrete components of the circuit but are included in the circuit to represent secondary effects of components. For example, resistors 225, 234, and 235 may not be discrete components, but rather can represent resistances of non-ideal components of the circuit.

Figure 3A:
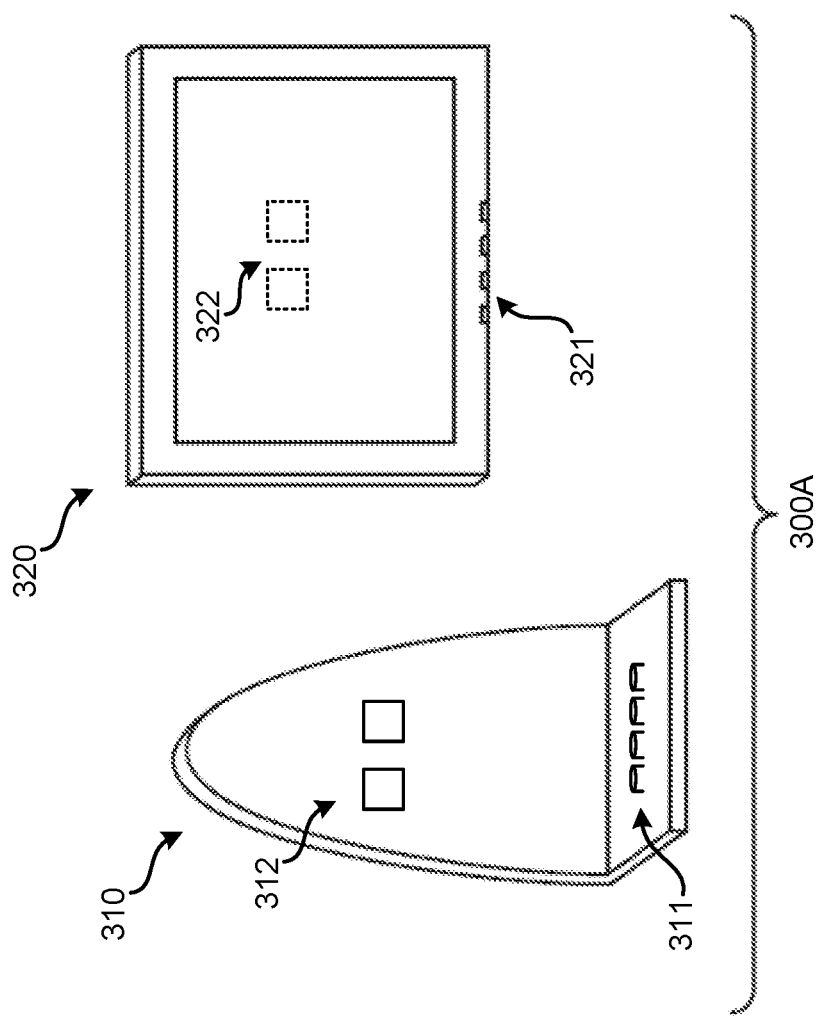
FIG. 3A illustrates an embodiment of a system that uses a bidirectional pulse driver circuit to assist in docking and undocking a tablet from a base.

FIG. 3A illustrates an embodiment of a tablet dock system 300A ("system 300A") that uses a bidirectional pulse driver circuit to assist in docking and undocking a tablet from a dock (which can be alternatively referred to as a base). Dock 310 can include components such as: a power supply; a stand that can support tablet 320; spring loaded pins 311; electromagnet assemblies which include soft magnets 312; a speaker; a microphone; and one or more status lights. Tablet 320 can include: a battery; a display (e.g., a touchscreen); a speaker; a microphone; a camera; contacts 321; and permanent magnets 322. These magnets can help align tablet 320 with dock 310 when a user is placing tablet 320 on dock 310 or may serve to firmly attach dock 310 with tablet 320. Such soft magnets, when engaged with the correct polarity, may make it either relatively hard or relatively easy for a user to disengage tablet 320 from dock 310.

Soft magnets 312 can be used to removably attached with permanent magnets 322, which can be located on a rear of tablet 320. The specific number and locations of soft magnets 312 and permanent magnets 322 can vary by embodiment. Further, in some embodiments, soft magnets 312 are located on tablet 320 instead of dock 310 (and permanent magnets 322 can be located on dock 310).

In system 300A, dock 310 may be typically left in a particular location and connected with line power, such as via an electrical outlet. When placed on dock 310, tablet 320 may be desired to firmly engage with dock 310 such that tablet 320 aligns and remains in a particular position (e.g., so that electrical contacts of dock 310 and tablet 320 are aligned and in contact). Circuit 100 or circuit 200 may be present in dock 310, tablet 320, or both to alter the polarity of one or more soft magnets of an electropermanent magnet assembly to either help keep tablet 320 and dock 310 firmly mated or to make it relatively easy to disengage tablet 320 from dock 310.

If circuit 100 or circuit 200 is present in dock 310, control signals may be sent from tablet 320 to control circuit 100 or circuit 200. If present in dock 310, if a message is to be output to a user, such as detailed in relation to method 500, a wireless message (e.g., a mesh networking protocol, Thread®, Bluetooth®, Wi-Fi®, etc.) may be transmitted from dock 310 to tablet 320.

Other possible embodiments of a system that uses a single rail bidirectional pulse driver circuit as detailed in relation to FIGS. 1-2 can include any two devices which are removably mated, such as: a smartphone and a charger or base; a laptop computer and dock; a thermostat and a backplate; a smartwatch and charger; a smart doorbell and mounting bracket; earbuds and a charger; headphones and a charger; a gaming device and a dock or charger. Further, embodiments of circuits 100 and 200 can be used in various other situations where a load needs to be driven with a current pulse from alternating terminals of the load.

Figure 3B:
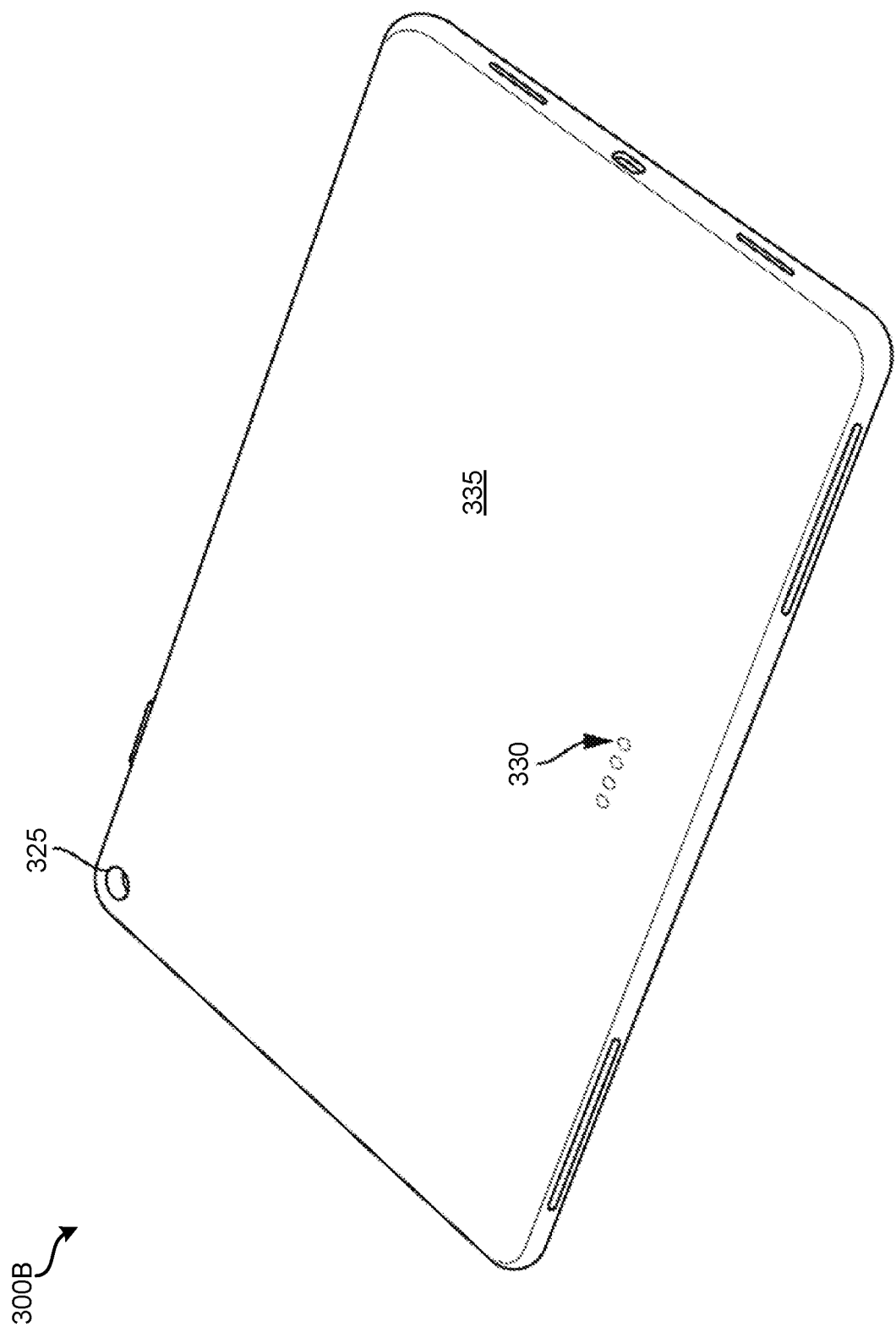
FIG. 3B illustrates an embodiment of an electronic device that docks with a dock using magnets.
Figure 3C:
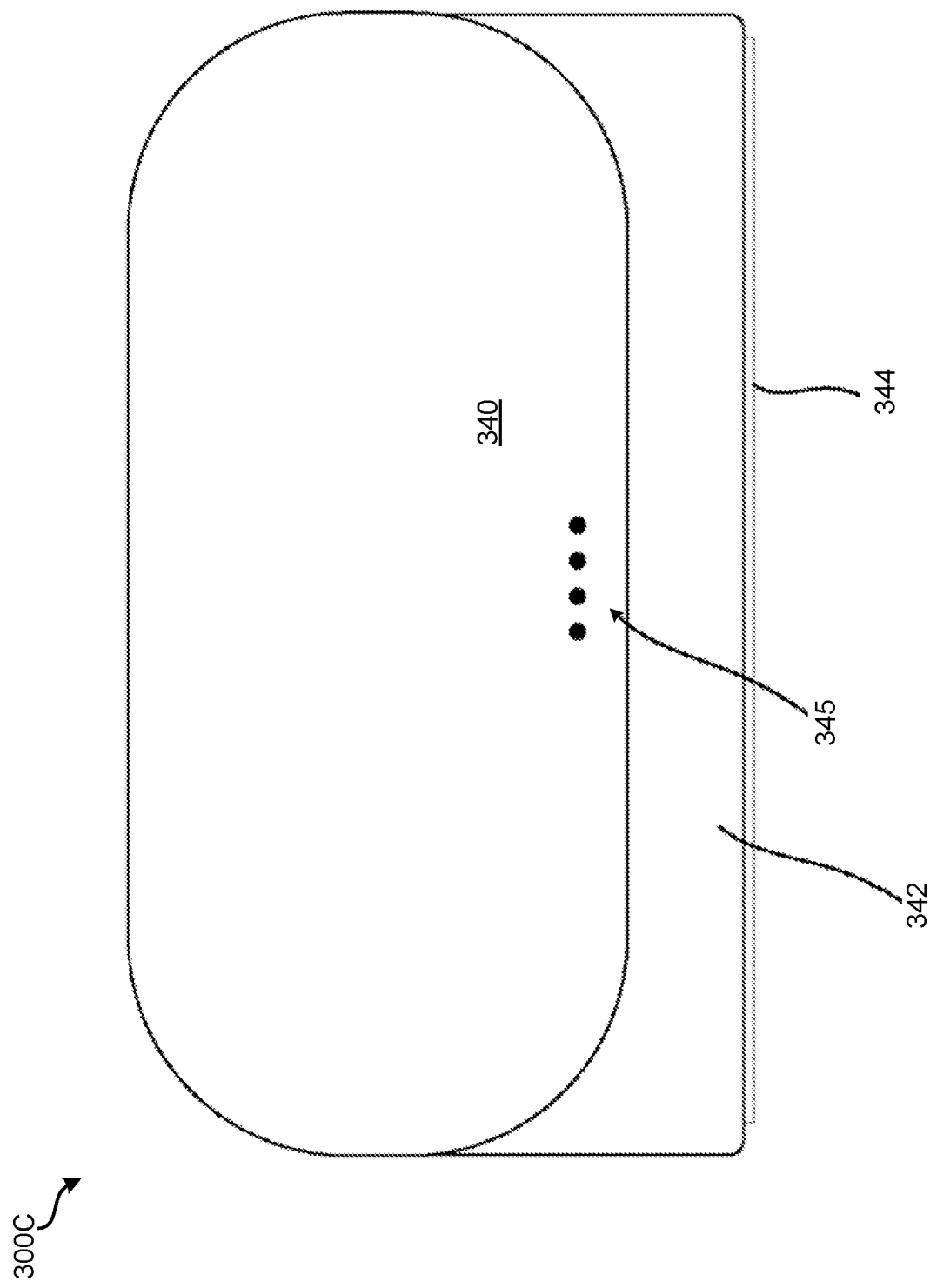
FIG. 3C illustrates a front view of a dock that can use magnets for docking and undocking.
Figure 3D:
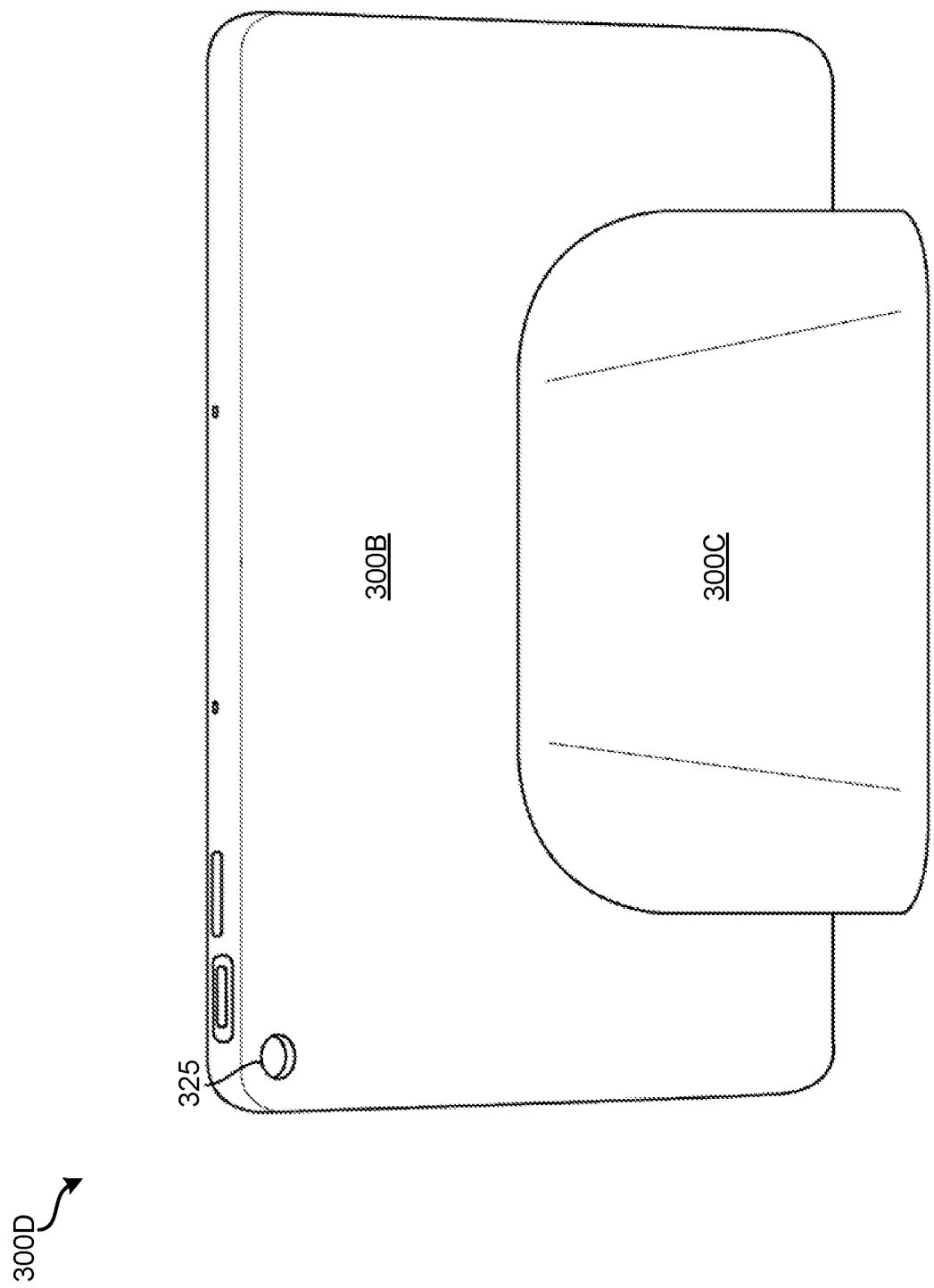
FIG. 3D illustrates a rear view of an embodiment of a system of an electronic device docked with a dock via magnets.

FIGS. 3B-3D represent embodiments that can incorporate the systems of FIGS. 1 and 2. FIG. 3B illustrates an embodiment of an electronic device 300B that is configured to dock with a dock using magnets and has electrical contacts 330. Electronic device 300B can be a tablet computer, or, more specifically, a tablet computer that serves as a home assistant device or hub as previously detailed. One or more magnets may be hidden within the electronic device 300B behind rear face 335. Electronic device 300B includes multiple conductive electrical contacts 330 (e.g., metallic pads) that are used to transfer data with and/or obtain power from a dock when the electronic device 300B is in a docked position. As illustrated, four electrical contacts 330 are present. In other embodiments, a greater or fewer number of electrical contacts 330 may be present. The arrangement of electrical contacts 330 can also vary by embodiment. In some embodiments, the electrical contacts comprise, for example, one or more contact pads, one or more pins, or a combination of pads and pins. Other components, such as camera 325, may be present on or accessible through rear face 335.

FIG. 3C illustrates a front view of a dock 300C, according to some embodiments. Dock 300C may include a mating system. The mating system of dock 300C may include a magnet system. The magnet system may include one or more magnets arranged to align with and magnetically couple with corresponding one or more magnets of a magnet system of an electronic device, such as electronic device 300B, docked with dock 300C such that a mating face of the electronic device (e.g., rear face 335) is held against mating face 340 of dock 300C by the magnetic fields of the magnet system of dock 300C and the magnet system of the electronic device.

The magnetic field sensors of dock 300C may include, for example, one or more magnetic field sensors, one or more magnetometers, one or more Hall effect sensors, and/or one or more other types of sensors configured to sense the presence of a magnet or a magnetic field. The magnetic field sensors may be configured to generate a signal indicative of a magnitude of a magnetic field, which can indicate proximity to one or more magnets.

Dock 300C may include a processing system configured to receive a signal indicating whether the electronic device is properly docked with the dock 300C. The signal may be initiated, for example, by, for example, either or both of the magnetic field sensors of dock 300C and magnetic field sensors of the electronic device. In response to receiving the signal, the processing system may be configured to provide power and/or communication signals to the electronic device through the electrical contacts 345 of the dock 300.

In some embodiments, dock 300C may include an internal speaker directed toward speaker face 342. Dock 300C may be configured to cause the internal speaker to generate sound according to, for example, data from an audio file, or according to, for example, signals from a microphone system.

In some embodiments, the dock 300C may include a stability foot 344, which significantly reduces sliding movement on a surface on which the dock 300C is placed. For example, the dock 300C may experience vibrations, for example caused by use of the speaker of dock 300C. Stability foot 344 of the dock 300C may be shaped so as to generate sufficient friction with the surface that the sliding movement is minimal or is prevented.

Foot 344 may comprise an elastomeric material. For example, in some embodiments, foot 344 includes silicon. In addition, foot 344 may be attached to a surface of the housing of dock 300C using an adhesive. In some embodiments, foot 344 is attached to the surface of the housing by topological features of foot 344 which protrude through holes in the surface of the housing. In some embodiments, foot 344 is attached to the surface of the housing using another mechanism, such as a fastener.

FIG. 3D illustrates a rear view of an embodiment of a system 300D of electronic device 300B docked with dock 300C, according to some implementations of the present disclosure. In some embodiments, either or both of electronic device 300B and dock 300C include magnets or magnet systems, for example, similar or identical to those discussed elsewhere herein, which cause electronic device 300B to be held in place against dock 300C, for example, such that mating face 335 of electronic device 300B is held in place against mating face 340 of dock 300C.

Figure 4:
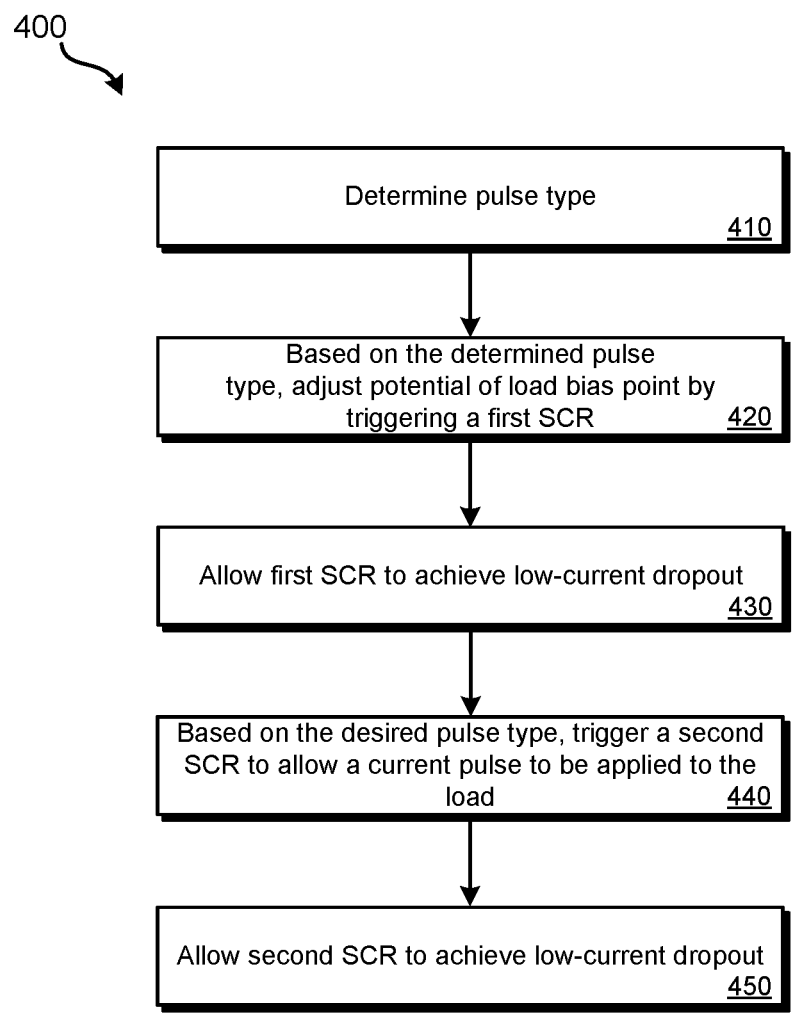
FIG. 4 illustrates an embodiment of a method for using a bidirectional pulse driver circuit.

Various methods can be performed using the systems and devices detailed in relation to FIGS. 1-3. FIG. 4 illustrates an embodiment of a method 400 for using a bidirectional pulse driver circuit. Method 400 can be performed using the circuits of FIG. 1, FIG. 2, or some variation on the circuit. Method 400 can be performed by a system that includes such a circuit integrated as part of a larger system, such as a tablet docking system as detailed in FIG. 3.

At block 410, a determination is made, such as by a controller device (e.g., a processor) as to the pulse type needed to be applied to a load. The pulse type can be selected from either a forward pulse or reverse pulse.

At block 420, based on the determined pulse type, a load bias of the circuit may be adjusted. The load bias may serve to bring the potential present at a terminal of the load either as close to rail voltage as possible (e.g., 90%-99% of rail voltage) or as close to ground as possible (e.g., 90%-99% of ground potential). A first SCR of one of the two pulse loop circuits may be triggered to adjust the load bias. If a forward pulse is to be applied to the load, the first SCR is the SCR of the reverse pulse loop circuit; and if a reverse pulse is to be applied to the load, the first SCR is the SCR of the forward pulse loop circuit. The triggering of block 420 can involve a series of one or more pulses being applied to trigger the first SCR one or more times. For example, in some embodiments, block 420 includes a pattern of 2-5 pulses being applied to the first SCR to trigger it multiple times. At the time block 420 is being performed, the second SCR remains open such that effectively no current passes through it.

At block 430, the first SCR enters a cutoff mode once the amount of current passes through the first SCR drops below a defined threshold causing the SCR to change from being closed to open. As detailed in relation to block 420, the first SCR may be triggered multiple times; therefore, blocks 420 and 430 may be performed multiple times before proceeding to block 440.

At block 440, the second SCR is triggered, by a controller, to produce the current pulse determined at block 410. Block 440 can be performed immediately after block 430 (e.g., within 0.1 ms) to prevent the load bias point potential from substantially returning to the midpoint between the rail voltage and ground potential. If a forward current pulse is to be produced, the second SCR is the SCR of the forward pulse loop circuit; if a reverse current pulse is to be produced, the second SCR is the SCR of the reverse pulse loop circuit. If the load bias was set to be approximately the rail voltage, triggering the SCR of the reverse pulse loop circuit causes a reverse pulse of current to flow through the load from the load bias point. If the load bias was set to be approximately the ground voltage potential, triggering the SCR of the forward pulse loop circuit causes a forward pulse of current to flow through the load to the load bias point.

Blocks 420 and 440 can be understood as a pattern of pulses over time that are applied to the first and second SCRs by a controller. Therefore, depending on the determined pulse type, one of two pulse patterns may be output by the controller to the SCRs or to intermediary trigger circuits, which in turn trigger the gates of the SCRs.

At block 450, the second SCR enters a cutoff mode once the amount of current passes through the second SCR drops below a defined threshold causing the second SCR to change from being closed to open. At this point, method 400 is complete and can then be repeated at some point in the future when another current pulse, likely in the opposite direction, is to be applied to the load.

Figure 5:
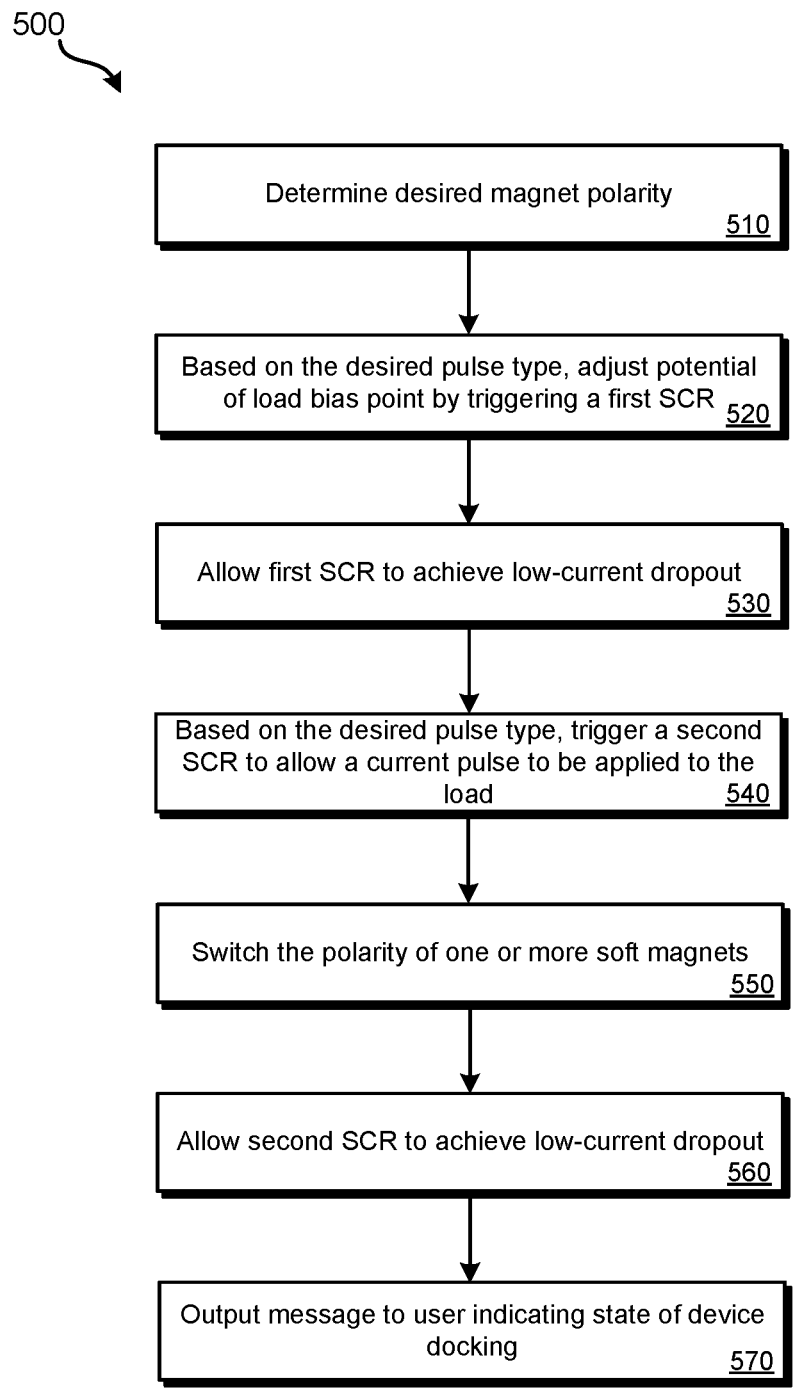
FIG. 5 illustrates an embodiment of a method for using a bidirectional pulse driver circuit to reverse the polarity of a soft magnet.

FIG. 5 illustrates an embodiment of a method 500 for using a bidirectional pulse driver circuit to reverse the polarity of one or more soft magnets. Method 500 is specifically directed to circumstances where the polarity of one or more soft magnets are to be reversed; therefore, incidental current pulses that do not reverse the polarity have little or no effect on the performance of the soft magnets or the system in which such magnets are integrated. Method 500 can be performed using a docking system such as that detailed in relation to FIG. 3.

At block 510, a determination is made, such as by a controller device (e.g., a processor) or component in communication with the controller as to the desired magnet polarity and the pulse type needed to be applied to the wire coiled around one or more soft magnets to achieve the polarity. The pulse type can be selected from either a forward pulse or reverse pulse.

At block 520, based on the determined pulse type or the desired magnet polarity, a potential of a load bias point of the circuit may be adjusted. The load bias point may have its potential adjusted to bring the potential present at a terminal of the one or more magnets either as close to rail voltage as possible (e.g., 90%-99% of rail voltage) or as close to ground as possible (e.g., 90%-99% of ground potential). A first SCR of one of the two pulse loop circuits may be triggered to adjust the load bias of the one or more magnets. If a forward pulse is to be applied to the one or more magnets, the first SCR is the SCR of the reverse pulse loop circuit; and if a reverse pulse is to be applied to the one or more magnets, the first SCR is the SCR of the forward pulse loop circuit. The triggering of block 520 can involve a series of one or more pulses being applied to trigger the first SCR one or more times. For example, in some embodiments, block 520 includes a pattern of 2-5 pulses being applied to the first SCR to trigger it multiple times. At the time block 520 is being performed, the second SCR remains open such that effectively no current passes through it.

The pulses of block 520, which cause one or more relatively smaller current pulses to flow through the wire coiled around the one or more soft (compared with block 540), will have little effect on the performance of the magnets since this current will likely cause pulses in a direction that does not affect the polarity of the soft magnets.

At block 530, the first SCR enters a cutoff mode once the amount of current passes through the first SCR drops below a defined threshold causing the SCR to change from being closed to open. As detailed in relation to block 520, the first SCR may be triggered multiple times; therefore, blocks 520 and 530 may be performed multiple times before proceeding to block 540.

At block 540, the second SCR is triggered to produce the current pulse determined at block 510. Block 540 can be performed immediately after block 530 (e.g., within 0.1 ms) to prevent the load bias point potential from substantially returning toward the midpoint between the rail voltage and ground potential. If a forward current pulse is to be produced for a first polarity, the second SCR is the SCR of the forward pulse loop circuit; if a reverse current pulse is to be produced to cause the second polarity to be present in the soft magnets, the second SCR is the SCR of the reverse pulse loop circuit. If the load bias point was set to have a potential of approximately the rail voltage, triggering the SCR of the reverse pulse loop circuit causes a reverse pulse of current to flow through a wire coiled around the magnets from the load bias point. If the load bias point was set to have a potential of approximately the ground voltage potential, triggering the SCR of the forward pulse loop circuit causes a forward pulse of current to flow through a wire coiled around the one or more magnets to the load bias point.

Blocks 520 and 540 can be understood as a pattern of pulses over time that are applied to the first and second SCRs by a controller. Therefore, depending on the determined pulse type, one of two pulse patterns may be output by the controller to the SCRs or to intermediary trigger circuits, which in turn trigger the gates of the SCRs.

At block 550, the pulse of block 540 can cause the polarity of the one or more soft magnets to reverse. The polarity may then stay in this state until a current pulse is applied in the opposite direction as to what was applied at block 540. This polarity adjustment can affect how the one or more soft magnets interact with other magnets, such as by either attracting or repelling each other.

At block 560, the second SCR enters a cutoff mode once the amount of current passes through the second SCR drops below a defined threshold causing the second SCR to change from being closed to open.

At block 570, a message may be output by a processor, such as via a display or speaker, that indicates the state of device docking involving the one or more soft magnets. For example, if the adjustment of the polarity of the soft magnets places a docking system in a mode in which a tablet can be easily removed from a base, the message may indicate that the tablet is ready for removal. If the adjustment of the polarity of the soft magnets places the docking system in a model in which the tablet is firmly attached with the base, the message may indicate that the tablet has been successfully docked with the base. At this point, method 500 is complete and can then be repeated at some point in the future when another current pulse, likely in the opposite direction, is to be applied to the one or more magnets to again reverse the polarity.

Figure 6:
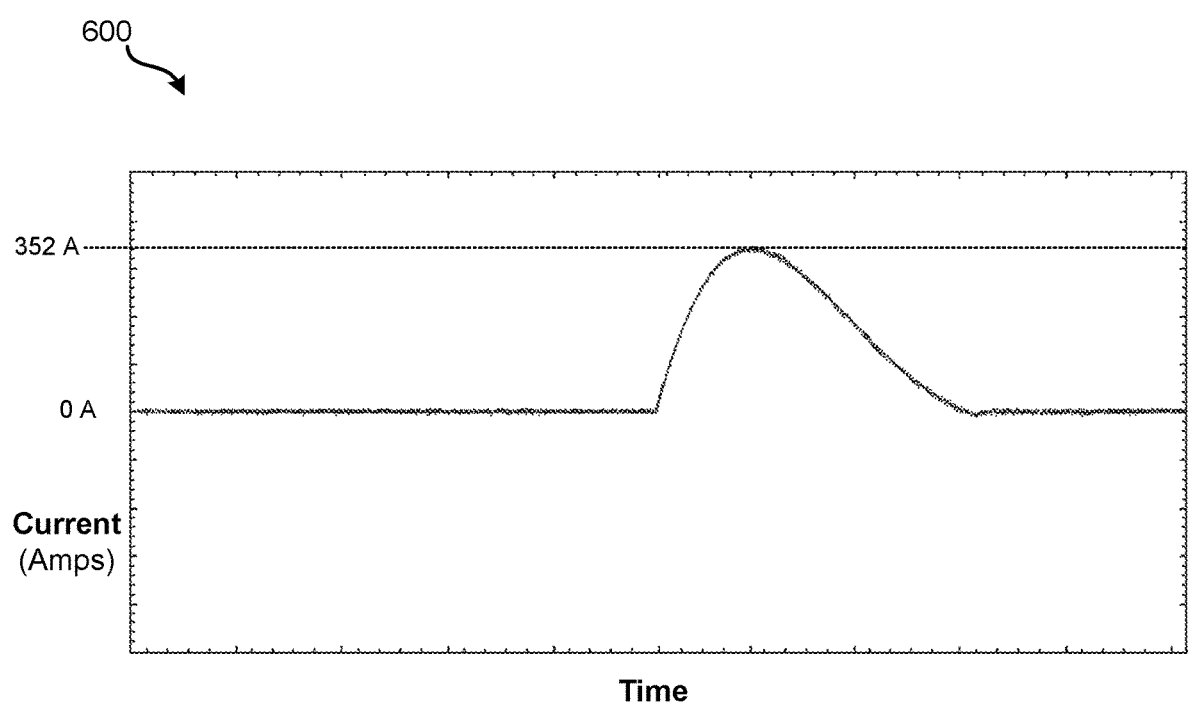
FIG. 6 illustrates a graph of a positive current pulse applied to a load by a bidirectional pulse driver circuit.

FIG. 6 illustrates a graph 600 of a forward current pulse applied to a load by a bidirectional pulse driver circuit. The forward current pulse can result in a large amount of current, such as between 300-400 Amps being briefly driven through a load, such as the wire coiled around one or more soft magnets. Such a high current may be necessary to reverse the polarity of the one or more soft magnets. The pulse may have a duration of between 10 µs and 50 ms; in one embodiment, the pulse duration is between 95 µs and 105 µs. The voltage potential applied to the wire coiled around one or more magnets may vary based on the number of soft magnets connected in series. For each magnet, a potential of between 20 V and 30 V may need to be applied; therefore, if 8 to 10 magnets are connected in series, the potential applied may be between 160 V and 300 V.

Figure 7:
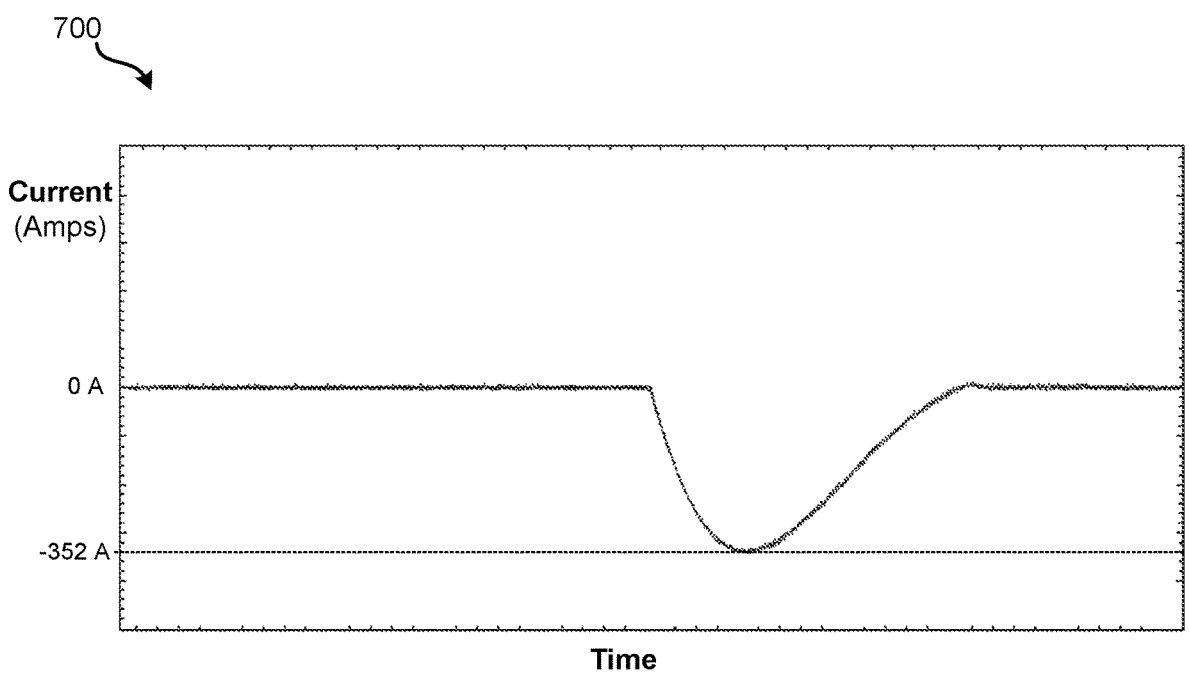
FIG. 7 illustrates a graph of a negative current pulse applied to a load by a bidirectional pulse driver circuit.

In contrast, FIG. 7 illustrates a graph 700 of a reverse current pulse applied to a load by a bidirectional pulse driver circuit. Measured at the same point as the data of graph 600, graph 700 appears negative because the current pulse is flowing in the opposite direction through the load. The reverse current pulse can result in a large amount of current, such as between 300-400 Amps being briefly driven through the load, such as wire coiled around one or more soft magnets, in the opposite direction of the pulse of graph 600. Again here, the pulse may have a duration of between 10 µs and 50 ms; in one embodiment, the pulse duration is between 95 µs and 105 µs. (In FIG. 7, the current pulse goes negative because it is in the opposite direction as the current pulse measured in graph 600.)

Figure 8:
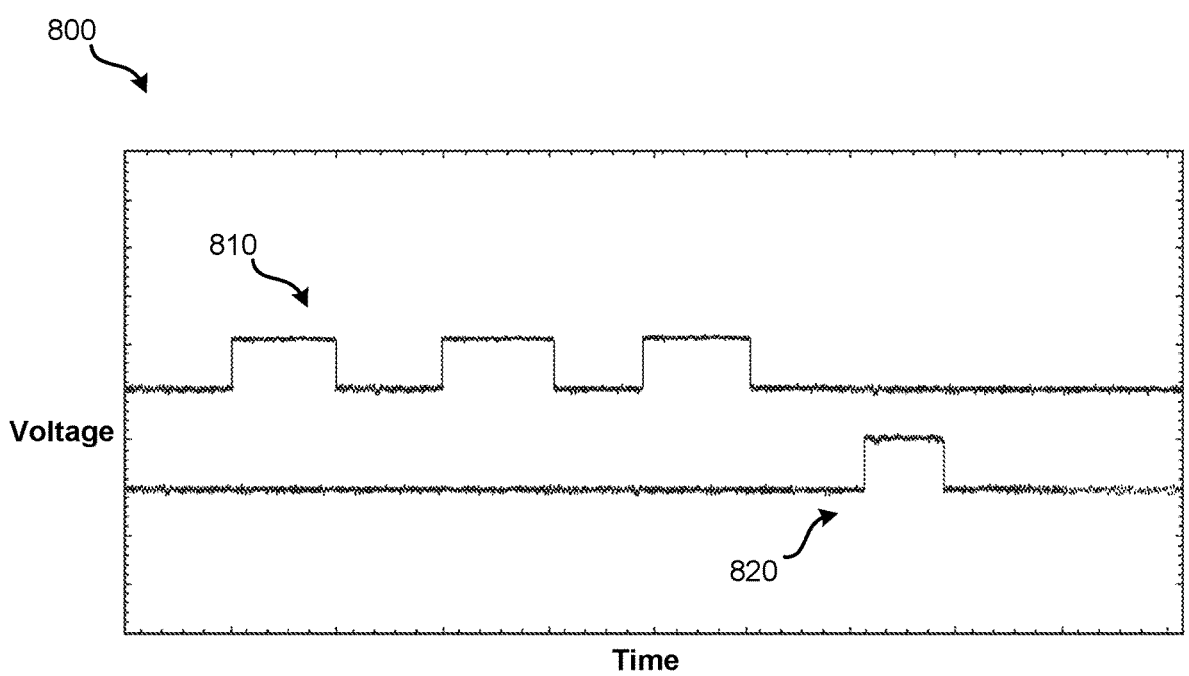
FIG. 8 illustrates a graph of a series of trigger pulses applied to a pair of silicon-controlled rectifiers (SCRs) of a bidirectional pulse driver circuit.

FIG. 8 illustrates a graph 800 of a pattern of trigger pulses applied to a pair of silicon-controlled rectifiers (SCRs) of a bidirectional pulse driver circuit. The pattern of pulses can be output directly by a controller to a pair of SCRs or to a pair of trigger circuits which in turn trigger the SCRs. In graph 800, two separate signals of 0 to 5 V are shown for comparison. In graph 800, a first pattern output by a controller in which SCR 226 has pulses 810 applied and SCR 236 has pulse 820 applied can cause a reverse pulse to be applied to a load. Alternatively, in graph 800, a second pattern in which SCR 236 has pulses 810 applied and SCR 226 has pulse 820 applied can cause a forward pulse to be applied to the load. The specific number of pulses applied as part of pulses 810 can be varied based on embodiments, such as between one and ten.

It should be noted that the methods, systems, and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

Specific details are given in the description to provide a thorough understanding of the embodiments. However, it will be understood by one of ordinary skill in the art that the embodiments may be practiced without these specific details. For example, well-known processes, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing embodiments of the invention. Various changes may be made in the function and arrangement of elements without departing from the spirit and scope of the invention.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

What is claimed is:

1. A bidirectional pulse driver circuit, comprising:
    a forward pulse trigger circuit;
    a forward pulse loop circuit connected with a load, wherein:
        the forward pulse loop circuit comprises a first silicon-controlled rectifier (SCR) that is activated by the forward pulse trigger circuit;
    a reverse pulse trigger circuit;
    a reverse pulse loop circuit connected with the load, wherein:
        the reverse pulse loop circuit comprises a second SCR that is activated by the reverse pulse trigger circuit; and
    a controller in communication with the forward pulse trigger circuit and the reverse pulse trigger circuit, wherein:
        the controller activates the forward pulse trigger circuit and the reverse pulse trigger circuit in a first pattern to cause a current pulse to be applied to the load in a first direction; and
        the controller activates the forward pulse trigger circuit and the reverse pulse trigger circuit in a second pattern to cause the current pulse to be applied to the load in a second direction.

2. The bidirectional pulse driver circuit of claim 1, wherein:
    the forward pulse loop circuit comprises a first capacitor;
    a first terminal of the first capacitor is connected with an anode of the first SCR; and
    a second terminal of the first capacitor is connected with a terminal of the load.

3. The bidirectional pulse driver circuit of claim 2, wherein:
    the reverse pulse loop circuit comprises a second capacitor;
    a first terminal of the second capacitor is connected with a cathode of the second SCR; and
    a second terminal of the second capacitor is connected with the terminal of the load and the second terminal of the first capacitor.

4. The bidirectional pulse driver circuit of claim 1, wherein the first pattern comprises the reverse pulse trigger circuit being activated a plurality of times, then the forward pulse trigger circuit being activated.

5. The bidirectional pulse driver circuit of claim 4, wherein the second pattern comprises the forward pulse trigger circuit being activated the plurality of times, then the reverse pulse trigger circuit being activated.

6. The bidirectional pulse driver circuit of claim 5, further comprising the load, wherein the load comprises a wire coiled around one or more soft magnets.

7. The bidirectional pulse driver circuit of claim 6, wherein a polarity of the one or more soft magnets is flipped based on a direction of the current pulse.

8. The bidirectional pulse driver circuit of claim 7, further comprising a tablet system comprising a tablet computer and a base.

9. The bidirectional pulse driver circuit of claim 8, wherein: the one or more soft magnets, the forward pulse trigger circuit, the forward pulse loop circuit, the reverse pulse trigger circuit, and the reverse pulse loop circuit are incorporated as part of the base.

10. The bidirectional pulse driver circuit of claim 9, wherein the tablet computer is configured to output an indication that the tablet computer and the base are ready for separation based on whether the first pattern or the second pattern was activated by the controller.

11. A tablet docking system, comprising:
    a computerized tablet;
    a dock onto which the computerized tablet docks; and
    a bidirectional pulse driver circuit, comprising:
        a forward pulse trigger circuit;
        a forward pulse loop circuit connected with a load comprising a wire coiled around a soft magnet, wherein:
            the forward pulse loop circuit comprises a first silicon-controlled rectifier (SCR) that is activated by the forward pulse trigger circuit;
        a reverse pulse trigger circuit;

a reverse pulse loop circuit connected with the load, wherein:
  the reverse pulse loop circuit comprises a second SCR that is activated by the reverse pulse trigger circuit; and
a controller in communication with the forward pulse trigger circuit and the reverse pulse trigger circuit, wherein:
  the controller activates the forward pulse trigger circuit and the reverse pulse trigger circuit in a first pattern to cause a current pulse to be applied to the load in a first direction to set a polarity of the soft magnet; and
  the controller activates the forward pulse trigger circuit and the reverse pulse trigger circuit in a second pattern to cause the current pulse to be applied to the load in a second direction to set the polarity of the soft magnet in reverse from the first pattern.

12. The tablet docking system of claim 11, wherein the polarity of the soft magnet associated with the first pattern allows for the computerized tablet to be removed from the dock easier than the polarity of the soft magnet associated with the second pattern.

* * * * *